United States Patent
Kinugasa et al.

[11] Patent Number: 5,821,797
[45] Date of Patent: Oct. 13, 1998

[54] PROTECTION CIRCUIT FOR SEMICONDUCTOR DEVICES

[75] Inventors: Masanori Kinugasa, Yokohama; Ryuji Fujiwara, Oita, both of Japan

[73] Assignee: Kabushiki Kaisha Toshiba, Kawasaki, Japan

[21] Appl. No.: 623,838

[22] Filed: Mar. 29, 1996

[30] Foreign Application Priority Data

Mar. 31, 1995 [JP] Japan .................................. 7-075740

[51] Int. Cl.⁶ .................................................. H03K 17/16
[52] U.S. Cl. ........................ 327/318; 327/327; 327/379; 361/111; 361/212; 257/355; 257/362
[58] Field of Search .................................. 327/310, 313, 327/318, 319, 320, 327, 328, 379, 389, 391; 361/56, 91, 111, 118, 212; 257/355–363

[56] References Cited

U.S. PATENT DOCUMENTS

| | | | |
|---|---|---|---|
| 4,811,155 | 3/1989 | Kuriyama et al. | 361/56 |
| 4,819,047 | 4/1989 | Gilfeather et al. | 361/91 |
| 4,996,626 | 2/1991 | Say | 361/91 |
| 5,173,755 | 12/1992 | Co et al. | 257/361 |
| 5,237,395 | 8/1993 | Lee | 361/56 |
| 5,272,586 | 12/1993 | Yen | 361/91 |
| 5,449,940 | 9/1995 | Hirata | 257/361 |
| 5,477,414 | 12/1995 | Li et al. | 361/56 |
| 5,539,327 | 7/1996 | Shigehara et al. | 361/91 |

FOREIGN PATENT DOCUMENTS

| | | |
|---|---|---|
| 0 516146 | 12/1992 | European Pat. Off. . |
| WO 92/07384 | 4/1992 | WIPO . |

OTHER PUBLICATIONS

Patent Abstracts of Japan, vol. 12, No. 7 (E–571), Jan. 9, 1988, JP–A–62–165969, Jul. 22, 1987.
Patent Abstracts of Japan, vol. 10, No. 201 (E–419), Jul. 15, 1986, JP–A–61–043468, Mar. 3, 1986.
Patent Abstracts of Japan, vol. 2, No. 11 (E–007), Jan. 26, 1978, JP–A–52–128081, Oct. 27, 1977.

Primary Examiner—Kenneth B. Wells
Attorney, Agent, or Firm—Oblon, Spivak, McClelland, Maier & Neustadt, P.C.

[57] ABSTRACT

A protection circuit (1) for input comprises two transistors (11, 12) connected in series between a first voltage supply ($V_{cc}$) and a second voltage supply (GND), and an intermediate junction point is used as an input terminal and an output terminal. When a surge voltage is applied to the input terminal, since terminals (51, 53) of the two transistors (11, 12) are connected to predetermined junction points in such a way that the transistors can operate as bipolar transistors or cause punch through phenomenon (without causing breakdown operation of a low response speed to surge voltage), the surge voltage can be absorbed at high speed, thus increasing anti-ESD (electro static discharge) rate. Further, a protection circuit for power supply comprises two transistors (31, 32) connected in parallel to each other between a first voltage supply ($V_{cc}$) and a second voltage supply (GND). Similarly, the terminals (65, 68) of the two transistors are connected to predetermined junction points in such a way that when a surge voltage is superimposed upon the supply voltage, at least one of the transistors can operate as a bipolar transistor, without causing breakdown operation.

9 Claims, 9 Drawing Sheets

PROTECTION CIRCUIT FOR SEMICONDUCTOR DEVICES

BACKGROUND OF THE INVENTION

1. Field of the Invention

The present invention relates to a protection circuit for protecting a semiconductor integrated circuit device from being broken down by ESD (electro static discharge), and more specifically to a protection circuit suitable for use between an input terminal and a voltage supply terminal to improve the reliability of the integrated circuit elements against ESD, in particular when the input terminal is provided with a voltage level converting function (for converting a high voltage to a low voltage).

2. Description of the Prior Art

When electric static discharge (ESD) generated from a human body or a machine enters the inside of a semiconductor integrated circuit device, this exerts a harmful influence upon the integrated circuits. In the worst case, the internal circuits thereof may be broken down by the ESD into an irrecoverable state. Under consideration of these circumstances, some standards about the anti-ESD performance have been so far prescribed for the semiconductor integrated circuit devices. Therefore, in the semiconductor integrated circuit devices, the products are always inspected as to whether the prescribed standard can be satisfied or not. In other words, the anti-ESD performance exerts a serious influence upon the reliability of the products of the semiconductor integrated circuit devices.

By the way, the semiconductor integrated circuit device is provided with a protection circuit in a surge flowing path (e.g., an input terminal or a voltage supply terminal) as a countermeasure against the ESD.

Figure 1:
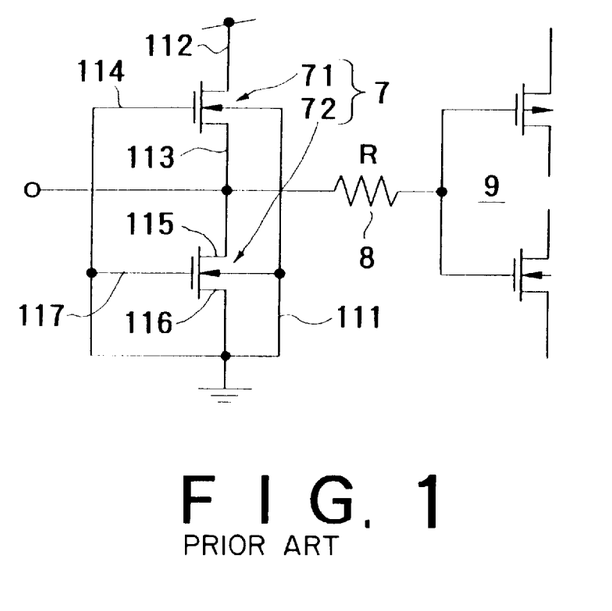
FIG. 1 is a circuit diagram showing an example of the prior art input protection circuit.

FIG. 1 shows an example of a prior art protection circuit, in which an input protection circuit 7 is connected to an input terminal of an input circuit 9 of a semiconductor integrated circuit. The input protection circuit 7 is composed of two series-connected n-channel MOS transistors 71 and 72. The input terminal of the input protection circuit 7 is connected to a junction point between the two n-channel MOS transistors 71 and 72. Further, the MOS transistor 71 is connected as a diode to a $V_{cc}$ terminal so as to be biased in a reverse direction when the voltage level at the input terminal exceeds a supply voltage. Therefore, the input protection circuit can realize such a voltage level conversion function that current will not flow from the input terminal to the $V_{cc}$ terminal; in other words, the input signal voltage level beyond the supply voltage level can be suppressed down to the supply voltage level, with the result that the input circuit 9 of the integrated circuit can be protected from ESD surge voltage applied to the input terminal. Further, a resistor 8 serves to reduce the sharp change in ESD voltage levels so that a thin gate oxide film of the MOS transistors for constituting the input circuit 9 can be prevented from being broken down.

FIGS. 2A to 2D show the device structure of the prior art input protection circuit 7 shown in FIG. 1. In these drawings, two MOS transistors 71 and 72 are formed on a p-type substrate 111. With respect to the MOS transistor 71, n-type impurity diffusion regions 112 and 113 are formed as a drain and a source, respectively, and a gate electrode 114 is formed between these two regions 112 and 113. The n-type impurity diffusion region 112 is connected to the $V_{cc}$ terminal; the n-type impurity diffusion region 113 is connected to the input terminal; and the gate electrode 114 is connected to a GND terminal. With respect to the other MOS transistor 72, n-type impurity diffusion regions 115 and 116 are formed as a drain and a source, respectively, and a gate electrode 117 is formed between these two regions 115 and 116. The n-type impurity diffusion region 115 is connected to the input terminal; the n-type impurity diffusion region 116 is connected to the GND terminal; and the gate electrode 117 is connected also the GND terminal.

The ESD absorption principle of the input protection circuit as constructed above will be explained hereinbelow together with the ESD application method for inspecting the above-mentioned products. Under consideration of the actually generated ESD modes, the following four ESD application methods are adopted in general:

Method 1-1: the GND terminal is connected to a ground potential, and (−) voltage is applied to the input terminal;

Method 1-2: the GND terminal is connected to the ground potential, and (+) voltage is applied to the input terminal;

Method 1-3: the $V_{cc}$ terminal is connected to the ground potential, and (−) voltage is applied to the input terminal;

Method 1-4: the $V_{cc}$ terminal is connected to the ground potential, and (+) voltage is applied to the input terminal.

Figure 2A:
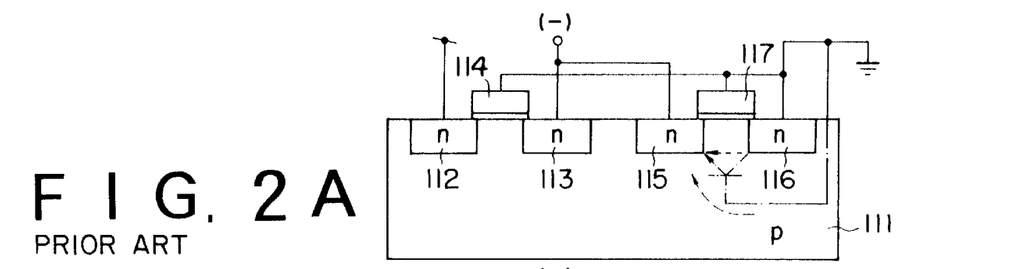
FIGS. 2A to 2D are cross-sectional views showing the device structure and the surge absorption operation of the prior art input protection circuit shown in FIG. 1.

In the method 1-1, as shown in FIG. 2A, the NPN transistor with the p-type substrate 111 as a base, with the n-type impurity diffusion region 115 as an emitter and with the n-type impurity diffusion region 116 as a collector operates as a bipolar transistor. As a result, the surge voltage can be absorbed by the currents as shown by the dashed lines in FIG. 2A.

Figure 2B:
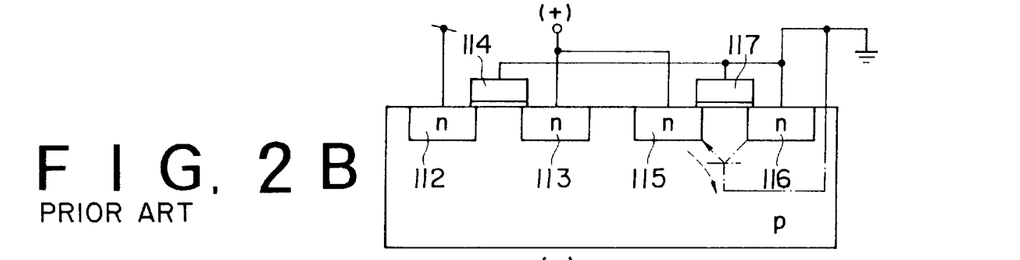

In the method 1-2, as shown in FIG. 2B, the NPN transistor with the p-type substrate 111 as a base, with the n-type impurity diffusion region 115 as an emitter and with the n-type impurity diffusion region 116 as a collector is broken down between the emitter and the base. As a result, the surge voltage can be absorbed by the break-down current as shown by the dashed line in FIG. 2B.

Figure 2C:
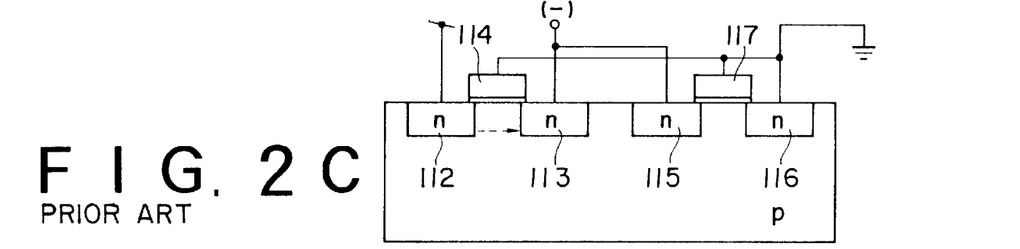

In the method 1-3, as shown in FIG. 2C, since the base (the p-type substrate 111) of the NPN transistor formed by the p-type substrate 111 and the n-type impurity diffusion regions 112 and 113 is open, punch through phenomenon due to a depletion layer is caused from the region 112 between the n-type impurity diffusion layers 112 and 113 by an electric field generated by the negative (−) surge voltage. As a result, the surge voltage can be absorbed by the current as shown by the dashed line in FIG. 2C.

Figure 2D:
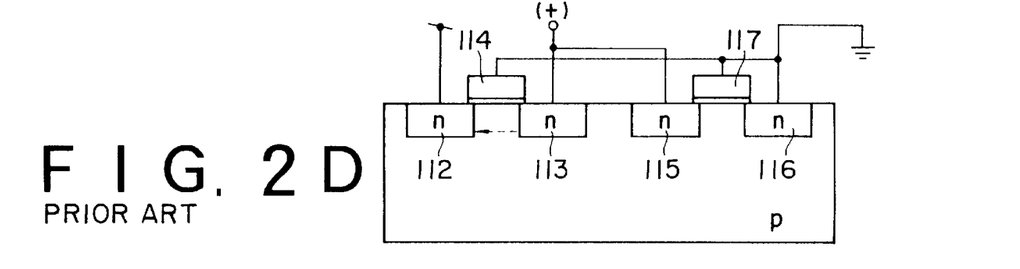

In the method 1-4, as shown in FIG. 2D, since the base (the p-type substrate 111) of the NPN transistor formed by the p-type substrate 111 and the n-type impurity diffusion regions 112 and 113 is open, the punch through phenomenon due to the depletion layer is caused from the region 113 between the n-type impurity diffusion layers 112 and 113 by an electric field generated by the positive (+) surge voltage. As a result, the surge voltage can be absorbed by the current as shown by the dashed line in FIG. 2D.

Figure 3:
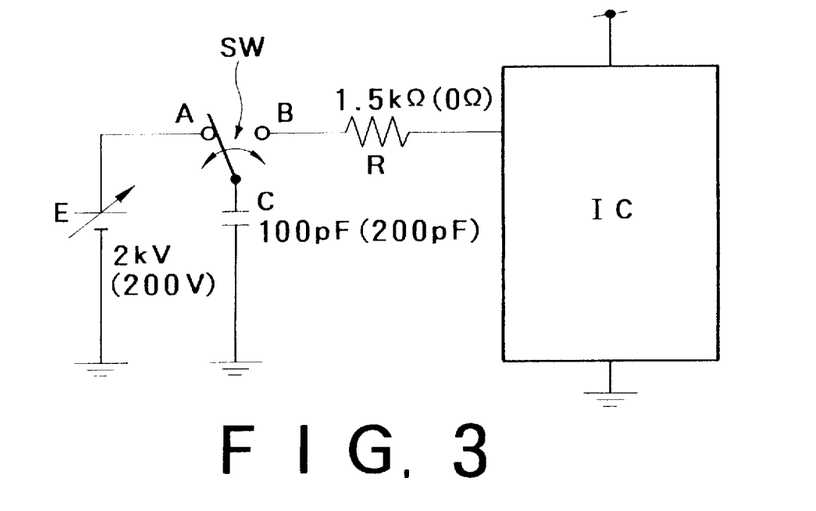
FIG. 3 is circuit diagram showing a test circuit for testing the surge absorption operation of the semiconductor integrated circuit.

The above-mentioned test work is performed by use of a test circuit as shown in FIG. 3 and in accordance with two models corresponding to the previously prescribed human body ESD and machine ESD, respectively. In more detail, as the human body model, MIL (US Military Standard) model having test circuit constants as CL=100 pF and RL=1.5 kohm is adopted, for instance. Further, as the machine model, EIAJ (Electrical Industries Association of Japan) model having test circuit constants as CL=200 pF and RL=0 ohm is adopted, for instance.

Further, in the test circuit shown in FIG. 3, a dc supply voltage E is connected between one movable contact A of a switch SW and a ground potential, and a resistor R is connected between the other movable contact B of the switch SW and an integrated circuit IC. Further, a capacitance is connected between a fixed contact and the ground potential. To apply a surge voltage to an input pin of the integrated circuit IC, first the capacitor C is connected to the supply voltage E via the switch SW, and then the switch SW is changed over to discharge the charge of the capacitor C into the integrated circuit IC through the resistor R.

In the case of the test in compliance with the MIL model, the resistance R is set to 1.5 kohm, and the capacitance C is set to 100 pF. In the case of the test in compliance with the EIAJ model, the resistance R is set to 0 ohm, and the capacitance is set to 200 pF. As a result of the test in each model, the anti-ESD rate of the MOS transistors having a gate width of about one micrometer is approximately as follows:

MIL method: 2 kV

EIAJ method: 200 V

Figure 4:
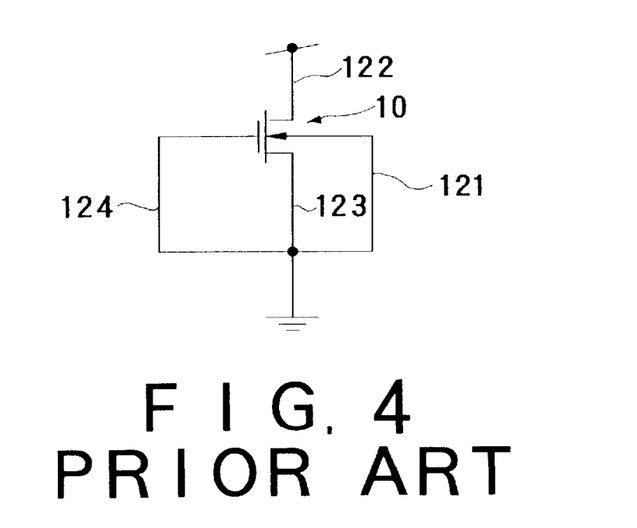
FIG. 4 is a circuit diagram showing an example of the prior art voltage supply protection circuit.

FIG. 4 shows a prior art voltage supply protection circuit connected to a voltage supply terminal. In this case, an n-type MOS transistor 10 is connected between the $V_{cc}$ terminal and the GND terminal in such a way that gate and source thereof are both grounded. Therefore, in this voltage supply protection circuit, all the MOS transistors formed in the semiconductor integrated circuit device can be protected from ESD applied to the $V_{cc}$ terminal or the GND terminal (or between both terminals).

FIGS. 5A to 5D show the device structure of the prior art voltage supply protection circuit 10 shown in FIG. 4. In these drawings, n-type impurity diffusion regions 122 and 123 are formed as a drain and a source, respectively on a surface portion of a p-type substrate 121. Further, a gate electrode 124 is formed on a channel forming region and between the two regions 122 and 123 (the drain and the source). The substrate 121, the n-type impurity diffusion region 123, and the gate electrode 124 are connected to the GND terminal, and the n-type impurity diffusion region 122 is connected to the $V_{cc}$ terminal.

The ESD absorption principle of the voltage supply protection circuit 10 as constructed above will be explained hereinbelow together with the ESD application methods for inspecting the above-mentioned products. The voltage application methods are basically the same as with the case of the afore-mentioned methods 1-1 to 1-4. In more detail, the following four ESD application methods are adopted in general:

Method 2-1: the GND terminal is connected to the ground potential, and (−) voltage is applied to the $V_{cc}$ terminal;

Method 2-2: the GND terminal is connected to the ground potential, and (+) voltage is applied to the $V_{cc}$ terminal;

Method 2-3: the $V_{cc}$ terminal is connected to the ground potential, and (−) voltage is applied to the GND terminal;

Method 2-4: the $V_{cc}$ terminal is connected to the ground potential, and (+) voltage is applied to the GND terminal.

Figure 5A:
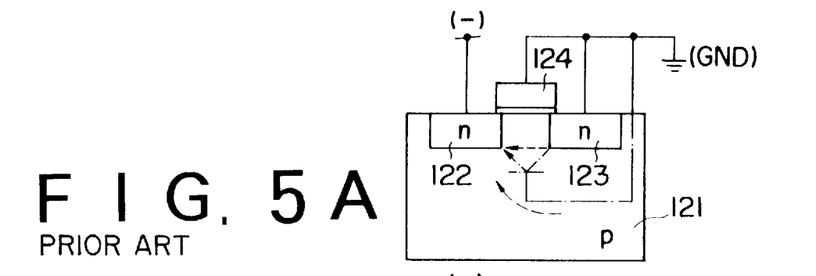
FIGS. 5A to 5D are cross-sectional views showing the device structure and the surge absorption operation of the prior art voltage supply protection circuit shown in FIG. 4.

In the method 2-1, as shown in FIG. 5A, the NPN transistor with the p-type substrate 121 as a base, with the n-type impurity diffusion region 122 as an emitter and with the n-type impurity diffusion region 123 as a collector operates as a bipolar transistor. As a result, the surge voltage can be absorbed by the currents as shown by the dashed lines in FIG. 5A.

Figure 5B:
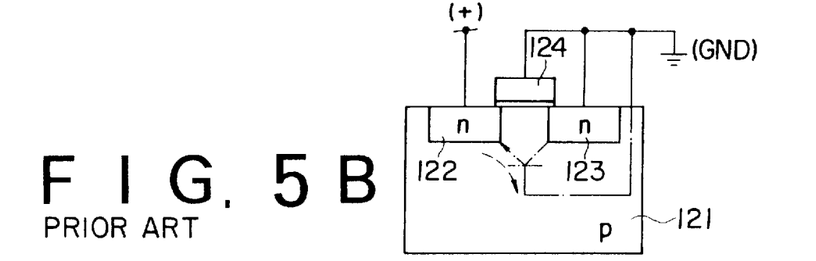

In the method 2-2, as shown in FIG. 5B, the NPN transistor with the p-type substrate 121 as a base, with the n-type impurity diffusion region 122 as an emitter and with the n-type impurity diffusion region 123 as a collector is broken down between the emitter and the base. As a result, the surge voltage can be absorbed by the break-down current as shown by the dashed line in FIG. 5B.

Figure 5C:
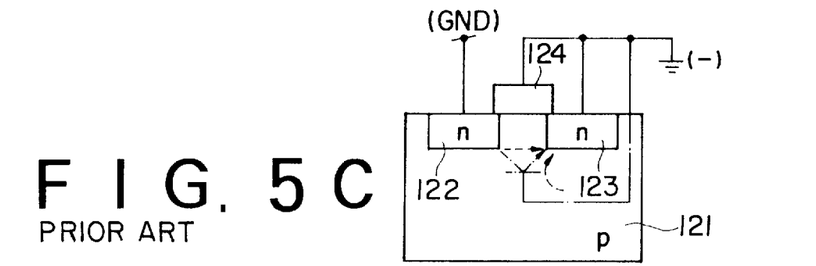

In the method 2-3, as shown in FIG. 5C, the NPN transistor with the p-type substrate 121 as a base, with the n-type impurity diffusion region 122 as a collector and with the n-type impurity diffusion region 123 as an emitter operates as a bipolar transistor. As a result, the surge voltage can be absorbed by the currents as shown by the dashed lines in FIG. 5C.

Figure 5D:
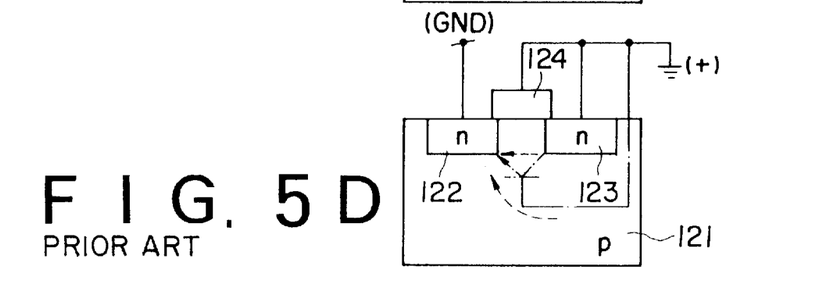

In the method 2-4, as shown in FIG. 5D, the NPN transistor with the p-type substrate 121 as a base, with the n-type impurity diffusion region 122 as an emitter and with the n-type impurity diffusion region 123 as a collector operates as a bipolar transistor. As a result, the surge voltage can be absorbed by the currents as shown by the dashed lines in FIG. 5D.

In the case of the test in compliance with the MIL model (human body model of CL=100 pF; RL=1.5 kohm) and the EIAJ model (machine model of CL=200 pF; RL=0 kohm), the anti-ESD rate of the MOS transistor having a gate width of about one micron is approximately as follows:

MIL method: 2 kV

EIAJ method: 200 V

In the above description, although the protection circuits are constructed as an n-channel type, it is of course possible to construct these protection circuits as a p-channel type.

As described above, in the prior art input or voltage supply protection circuits, since ESD can be absorbed, it is possible to secure the reliability of the integrated circuit devices against the external ESD.

In the prior art protection circuits, however, since the protection operation is partially dependent upon the breakdown operation between the n-type region and the p-type region of the transistor, there so far exists a problem. This is because the breakdown operation of the transistor occurs much later after the surge voltage has been applied, as compared with the bipolar operation and the punch through phenomenon. In other words, the response speed of the transistor breakdown operation to the surge voltage is relatively slow, in comparison with the bipolar operation and the punch through phenomenon. In addition, the anti-ESD rate of the breakdown operation is the lowest among these three operations. Therefore, even if the protection circuit dependent upon the breakdown operation is connected to the input terminal or the voltage supply terminal of the semiconductor integrated circuit device, there still exists such a possibility that the internal circuits of the integrated circuit device may be broken down or damaged before the breakdown operation is caused by the surge voltage in the protection circuit, so that a further improvement has been so far needed.

SUMMARY OF THE INVENTION

Accordingly, it is the object of the present invention to provide a protection circuit for a semiconductor integrated circuit device, which can improve the anti-ESD rate by improving the response speed of the protection circuit, when ESD surge voltage is applied to the input terminal thereof.

It is another object of the present invention to provide a protection circuit which can protect the semiconductor integrated circuit device from ESD, by retaining the voltage level converting function when the input signal voltage exceeds the supply voltage.

It is the further object of the present invention to provide a protection circuit for semiconductor integrated circuit device, which can improve the anti-ESD rate when ESD surge voltage is applied to the voltage supply terminal.

According to the first aspect of the present invention, there is provided a protection circuit for a semiconductor integrated circuit device, comprising:

a first transistor having one end connected to a first voltage supply;

a second transistor having one end connected to the other end of said first transistor and the other end connected to a second voltage supply;

an input terminal and an output terminal both connected to an intermediate junction point between said first and second transistors; and the first and second voltage supplies being so selected that when a surge voltage is applied to said input terminal, both said first and second transistors cause bipolar transistor function or punch through phenomenon without causing breakdown, and a base or a gate of said first and second transistors being connected to a predetermined junction point, respectively.

According to the second aspect of the present invention, there is provided a protection circuit for a semiconductor integrated circuit device, comprising:

first and second transistors connected in parallel to each other and having one end connected to a first voltage supply and the other end connected to a second voltage supply, respectively; and the first and second voltage supplies being so selected that when a surge voltage develops at at least one of the first and second voltage supplies, both said first and second transistors cause bipolar transistor function or punch through phenomenon without causing breakdown, and a base or a gate of said first and second transistors being connected to a predetermined junction point, respectively.

Further, according to the third aspect of the present invention, there is provided a protection circuit for a semiconductor integrated circuit device, comprising:

a first-conductivity type semiconductor substrate;

a second-conductivity type well region formed on a surface of said first-conductivity type semiconductor substrate and connected to an input terminal and an output terminal;

a first first-conductivity type diffusion region formed on a surface of said second-conductivity type well region and connected to the input terminal;

a second first-conductivity type diffusion region formed on the surface of said second-conductivity type well region and connected to a first voltage supply terminal; and when a surge voltage is applied to the input terminal, the applied surge voltage being absorbed by a bipolar transistor formed by said first and second first-conductivity type diffusion regions with said second-conductivity well region as a base thereof.

According to the fourth aspect of the present invention, there is provided a protection circuit for a semiconductor integrated circuit device, comprising:

a first-conductivity type semiconductor substrate;

a second-conductivity type well region formed on a surface of said first-conductivity type semiconductor substrate and connected to a first voltage supply terminal;

a first first-conductivity type diffusion region connected to the first voltage supply terminal, and a second first-conductivity type diffusion region connected to a second voltage supply terminal, said first and second first-conductivity type diffusion regions being both formed on a surface of said second-conductivity type well region by a predetermined distance away from each other;

a first second-conductivity type diffusion region connected to the first voltage supply terminal, and a second second-conductivity type diffusion region connected to the second voltage supply terminal, said first and second second-conductivity type diffusion regions being both formed on the surface of said first-conductivity substrate by a predetermined distance away from each other; and when a surge voltage is applied to the first and second voltage supply terminals respectively, the applied surge voltage being absorbed by a first bipolar transistor formed by said first and second first-conductivity type diffusion regions with said second-conductivity well region as a base thereof, and by a second bipolar transistor formed by said first and second second-conductivity diffusion regions with said semiconductor substrate as a base.

DETAILED DESCRIPTION OF THE PREFERRED EMBODIMENTS

Embodiments of the present invention will be described hereinbelow with reference to the attached drawings.

Figure 6:
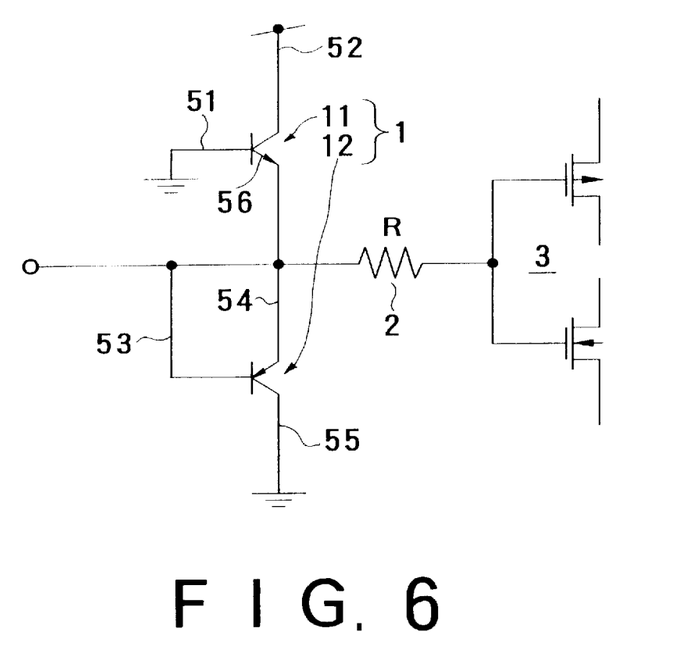
FIG. 6 is a circuit diagram showing the circuit structure of a first embodiment of the input protection circuit according to the present invention.

FIG. 6 is a circuit diagram showing the circuit structure of a first embodiment of the input protection circuit according to the present invention. The input protection circuit 1 comprises series-connected NPN transistor 11 and PNP transistor 12. A base 51 of the NPN transistor 11 is grounded and a collector thereof is connected to a $V_{cc}$ terminal. Therefore, the NPN transistor 11 is connected between an input terminal and the $V_{cc}$ terminal in such a way so as to be biased in the reverse direction when the input signal voltage exceeds the supply voltage. Therefore, when a voltage beyond the supply voltage is applied to the input terminal, the NPN transistor 11 is provided with such a level converting function as to suppress the input voltage level down to the supply voltage level, that is, to prevent current from flowing from the input terminal to the $V_{cc}$ terminal.

On the other hand, a base 53 and an emitter 54 of the PNP transistor 12 are connected to the input terminal and a collector 55 thereof is grounded. Therefore, the PNP transistor 12 is connected in such a way that when the input signal is at a positive (+) voltage, a reverse bias voltage is applied to the base thereof; and when the input signal is at a negative (−) voltage, a reverse bias voltage is applied between the emitter 54 and the collector 55. Therefore, the PNP transistor 12 can protect the input circuit 3 of the integrated circuit device from ESD surge voltage in cooperation with the NPN transistor 11. Further, in FIG. 6, a resistor 2 is connected between the input protection circuit 1 and the input circuit 3 to reduce the abrupt change of the ESD voltage levels and further to prevent a thin gate oxide film of the MOS transistors for constructing the input circuit 3 from being broken down.

The principle of ESD absorption by the input protection circuit 1 shown in FIG. 6 will be described hereinbelow in further detail.

FIGS. 7A to 7D are cross-sectional views for assistance in explaining the ESD absorption principle of the first embodiment shown in FIG. 6. The ESD is applied in the same way as with the case of the prior art input protection circuit as follows:

Method 3-1: the GND terminal is connected to a ground potential, and (−) voltage is applied to the input terminal;

Method 3-2: the GND terminal is connected to the ground potential, and (+) voltage is applied to the input terminal;

Method 3-3: the $V_{cc}$ terminal is connected to the ground potential, and (−) voltage is applied to the input terminal;

Method 3-4: the $V_{cc}$ terminal is connected to the ground potential, and (+) voltage is applied to the input terminal.

Figure 7A:
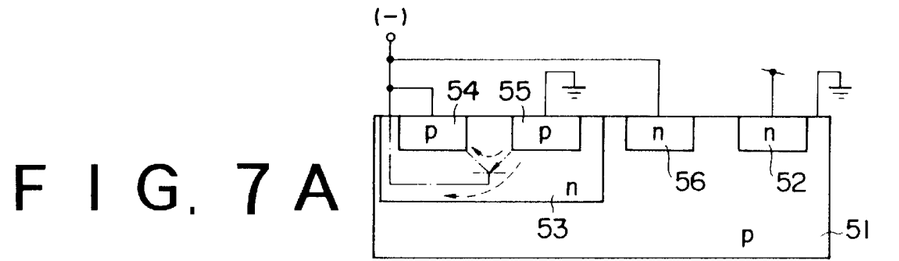
FIGS. 7A to 7D are cross-sectional views showing the device structure and the surge absorption operation of the first embodiment of the input protection circuit shown in FIG. 6.

In the method 3-1, as shown in FIG. 7A, the PNP transistor with an n-type impurity diffusion region 53 as a base, with a p-type impurity diffusion region 54 as a collector, and with a p-type impurity diffusion region 55 as an emitter operates as a bipolar transistor. As a result, the surge voltage can be absorbed by the currents as shown by the dashed lines in FIG. 7A.

Figure 7B:
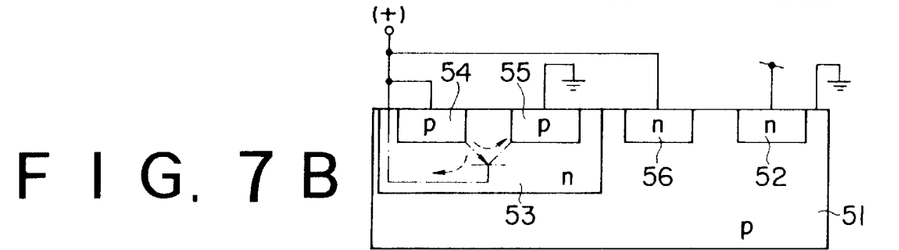

In the method 3-2, as shown in FIG. 7B, the NPN transistor with the n-type well region 53 as a base, with the p-type impurity diffusion region 54 as an emitter, and with the p-type impurity diffusion region 55 as a collector operates as a bipolar transistor. As a result, the surge voltage can be absorbed by the currents as shown by the dashed lines in FIG. 7B.

Further, in the PNP transistor, when a positive (+) voltage is applied to the base 53 thereof, since the PNP transistor is biased in the reverse direction, it seems that the transistor does not operate as a bipolar transistor. However, since there exists a parasitic resistance in the n-type impurity diffusion region 53, a rise in surge voltage is much delayed in the n-type impurity diffusion region 53 as compared with the p-type impurity diffusion region 54 and thereby the voltage between the emitter 54 and base 53 is biased momentarily in the forward direction, with the result that the bipolar operation can be established.

Figure 7C:
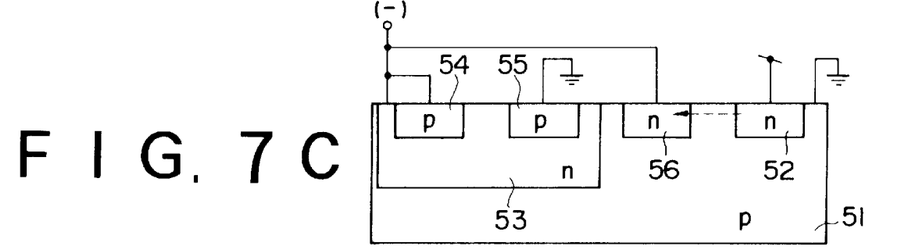

Further, in the method 3-3, as shown in FIG. 7C, since the base (a p-type substrate 51) of the NPN transistor formed by a p-type substrate 51 and two n-type impurity diffusion regions 52 and 56 is open, punch through phenomenon due to a depletion layer is caused from the n-type impurity diffusion layer 52 between the n-type impurity diffusion layers 52 and 56 by an electric field generated by the negative (−) surge voltage. As a result, the surge voltage can be absorbed by the current as shown by the dashed line in FIG. 7C.

Figure 7D:
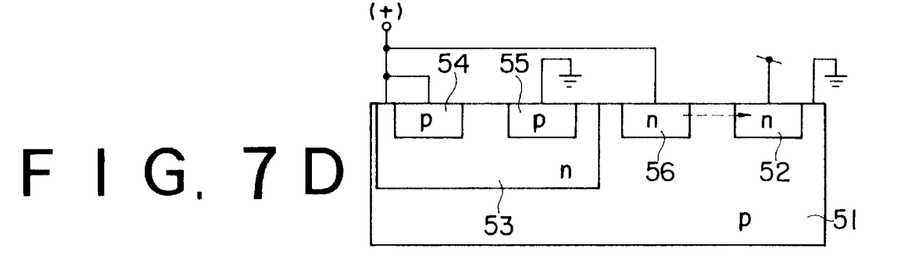

In the method 3-4, as shown in FIG. 7D, since the base (the p-type substrate 51) of the NPN transistor formed by the p-type substrate 51 and the two n-type impurity diffusion regions 52 and 54 is open, punch through phenomenon due to the depletion layer is caused from the n-type impurity diffusion region 56 between the n-type impurity diffusion layers 52 and 56 by an electric field generated by the positive (+) surge voltage. As a result, the surge voltage can be absorbed by the current as shown by the dashed line in FIG. 7D.

Here, Table 1 lists the operations in comparison between the prior art input protection circuit (FIGS. 2A to 2D) and the invention input protection circuit (shown in FIGS. 7A to 7D).

TABLE 1

|  | PRIOR ART INPUT PROTECT CIRCUIT | | INVENTION INPUT PROTECT CIRCUIT | |
| --- | --- | --- | --- | --- |
|  | (−) TO INPUT | (+) TO INPUT | (−) TO INPUT | (+) TO INPUT |
| GND IS GROUNDED $V_{CC}$ IS GROUNDED | BIPOLAR PUNCH THROUGH | BREAKDOWN PUNCH THROUGH | BIPOLAR PUNCH THROUGH | BIPOLAR PUNCH THROUGH |

In table 1, "(−) or (+) to input" implies that a negative (−) or positive (+) voltage is applied to the input terminal of the input protection circuit.

As described above, in the input protection circuit according to the present invention, since the bipolar operation or the punch through phenomenon can be established in all the modes (without causing breakdown operation), it is possible to absorb surge voltage at a high response speed based upon the bipolar operation and the punch through phenomenon.

Figure 8:
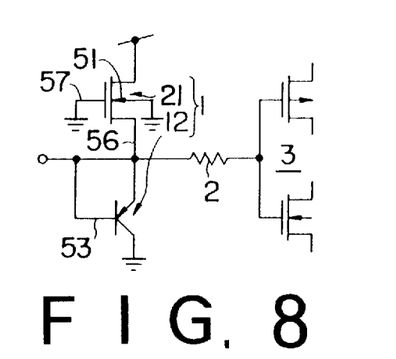
FIG. 8 is a circuit diagram showing the circuit structure of a second embodiment of the input protection circuit according to the present invention.

FIG. 8 is a circuit diagram showing the circuit structure of a second embodiment of the input protection circuit according to the present invention. In this input protection circuit 1', the transistor 11 connected between the input terminal and the $V_{cc}$ terminal shown in FIG. 6 is replaced with an N-channel MOS transistor having a grounded gate electrode 57.

Figure 9:
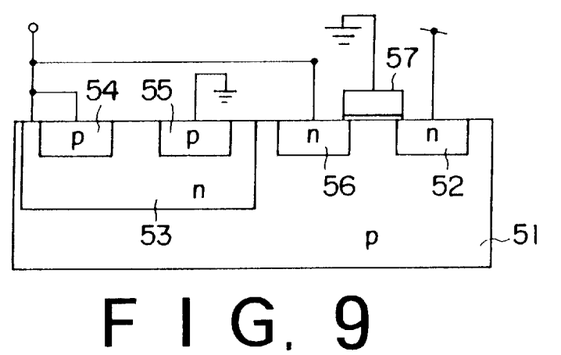
FIG. 9 is a cross-sectional view showing the device structure of the second embodiment of the input protection circuit shown in FIG. 8.

FIG. 9 is a cross-sectional view showing the device structure of the input protection circuit 1', in which the gate electrode 57 is formed on a channel forming region between the two n-type impurity diffusion regions 52 and 56. The operation of the this second embodiment of the input protection circuit 1' shown in FIG. 8 is quite the same as with the case of the first embodiment already explained with-reference to FIGS. 7C and 7D.

In this second embodiment, since the transistor 11 connected between the input terminal and the $V_{cc}$ terminal is replaced with an N-channel MOS transistor, the distance between the two n-type impurity diffusion regions 52 and 56 can be scaled easily by controlling the process of introducing n-type impurities after the gate electrodes have been patterned, so that it is possible to reduce the dispersion of the element characteristics of the input protection circuits.

Figure 10:
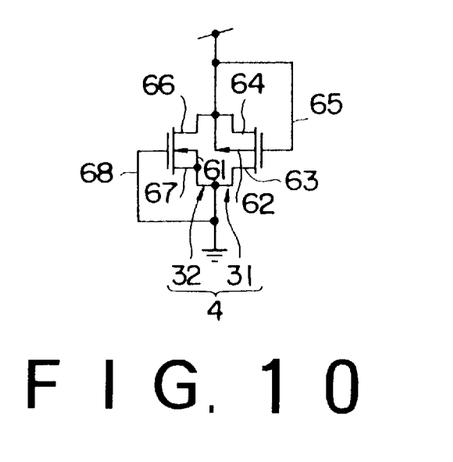
FIG. 10 is a circuit diagram showing the circuit structure of a first embodiment of the voltage supply protection circuit according to the present invention.

FIG. 10 is a circuit diagram showing the circuit construction of a first embodiment of the voltage supply protection circuit, which is additionally connected to the voltage supply terminal. In this case, the voltage supply protection circuit 4 is composed of a P-channel MOS transistor 31 and an N-channel MOS transistor 32 connected in parallel to each other between a $V_{cc}$ terminal and a GND terminal, by connecting two sources and two drains of these two transistors each other, respectively. This protection circuit can protect all the MOS transistors formed inside the semiconductor integrated circuit from ESD applied from the outside to the voltage supply terminal.

Figure 11A:
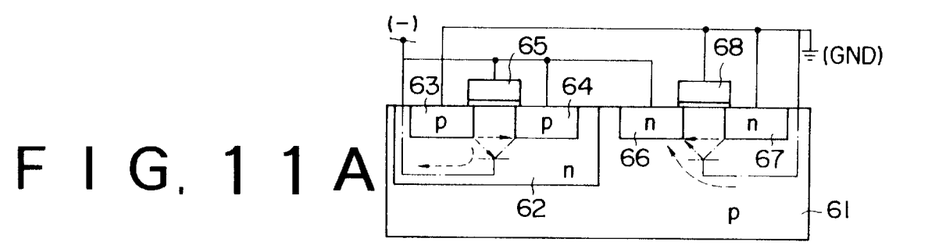
FIGS. 11A to 11D are cross-sectional views showing the device structure and the surge absorption operation of the first embodiment of the voltage supply protection circuit shown in FIG. 10.

FIGS. 11A to 11D show the device structure of the voltage supply protection circuit shown in FIG. 10. In FIG. 11A, an n-type impurity diffusion region 62 is formed on the surface of a p-type substrate 61. In this n-type impurity diffusion region 62, two p-type impurity diffusion regions 63 and 64 (source and drain) are formed. Further, a gate electrode 65 is formed on a channel forming region between the two regions 63 and 64. Here, the n-type impurity diffusion region 62, the p-type impurity diffusion region 64 and the gate electrode 65 are connected to the $V_{cc}$ terminal. Further, the p-type impurity diffusion region 63 is connected to the GND terminal. These n-type impurity diffusion region 62 and the two p-type impurity diffusion regions 63 and 64 constitute a P-channel MOS transistor 31.

Further, in the vicinity of the n-type impurity diffusion region 62 (in which the P-channel MOS transistor 31 is formed) of the p-type substrate 61, two n-type impurity diffusion regions 66 and 67 (source and drain) are formed. Further, a gate electrode 68 is formed on a channel forming region between the two regions 66 and 67. Here, the n-type impurity diffusion region 66 is connected to the $V_{cc}$ terminal. The p-type substrate 61, the n-type impurity diffusion region 67, and the gate electrode 68 are connected to the GND terminal.

The ESD absorption principle of the first embodiment of the voltage supply protection circuit shown in FIG. 10 will be described hereinbelow.

FIGS. 11A to 11D are cross-sectional views for assistance in explaining the ESD absorption principle of the first embodiment shown in FIG. 10. The ESD is applied in the same way as with the case of the prior art protection circuit as follows:

Method 4-1: the GND terminal is connected to a ground potential, and (−) voltage is applied to the $V_{cc}$ terminal;

Method 4-2: the GND terminal is connected to the ground potential, and (+) voltage is applied to the $V_{cc}$ terminal;

Method 4-3: the $V_{cc}$ terminal is connected to the ground potential, and (−) voltage is applied to the GND terminal;

Method 4-4: the $V_{cc}$ terminal is connected to the ground potential, and (+) voltage is applied to the GND terminal.

In the method 4-1, as shown in FIG. 11A, the NPN transistor with the n-type impurity diffusion region 62 as a base, with the p-type impurity diffusion layer 63 as an emitter, and with the p-type impurity diffusion region 64 as a collector operates as a bipolar transistor. Further, the NPN transistor with the p-type substrate 61 as a base, with the n-type impurity diffusion layer 66 as an emitter, and with the n-type impurity diffusion region 67 as a collector also operates as a bipolar transistor. As a result, the surge voltage can be absorbed by the currents as shown by the dashed lines in FIG. 11A.

Figure 11B:
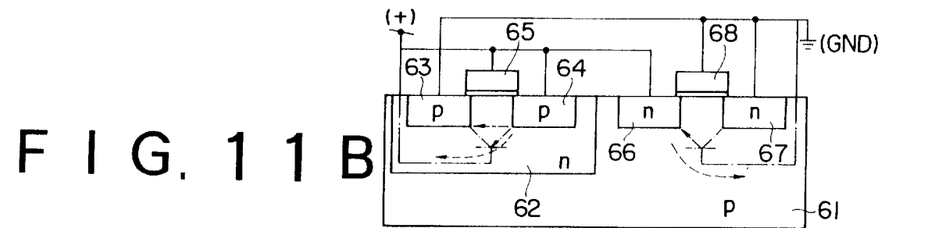

In the method 4-2, as shown in FIG. 11B, although a region between the emitter and the base of the NPN transistor with the p-type substrate 61 as a base, with the n-type impurity diffusion layer 66 as an emitter, and with the n-type impurity diffusion region 67 as a collector is broken down, the PNP transistor with the n-type well region 62 as a base, with the p-type impurity diffusion region 63 as a collector and with the p-type impurity diffusion region 64 as an emitter operates as a bipolar transistor earlier than the breakdown operation of the NPN transistor. As a result, the surge voltage can be absorbed by the currents as shown by the two dashed lines in FIG. 11B.

Figure 11C:
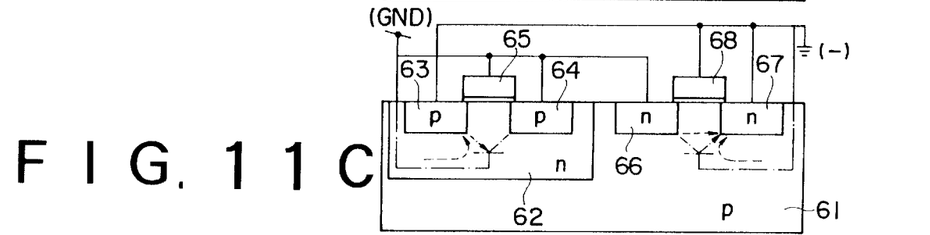

Further, in the method 4-3, as shown in FIG. 11C, although a region between the emitter and the base of the PNP transistor with the n-type well 62 as a base, with the p-type impurity diffusion layer 63 as an emitter, and with the p-type impurity diffusion region 64 as a collector is broken down, the NPN transistor with the p-type substrate 61 as a base, with the n-type impurity diffusion region 66 as a collector and with the n-type impurity diffusion region 67 as an emitter operates as a bipolar transistor earlier than the breakdown operation of the PNP transistor. As a result, the surge voltage can be absorbed by the currents as shown by the dashed lines in FIG. 11C.

Figure 11D:
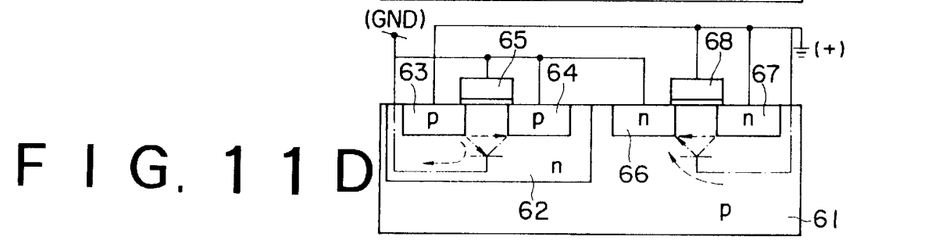

In the method 4-4, as shown in FIG. 11D, the PNP transistor with the n-type well region 62 as a base, with the p-type impurity diffusion region 63 as an emitter, and with the p-type impurity diffusion region 64 as a collector operates as a bipolar transistor. Further, the NPN transistor with the p-type substrate 61 as a base, an n-type impurity diffusion region 66 as an emitter, and an n-type impurity diffusion region 67 as a collector operates as a bipolar transistor. As a result, the surge voltage can be absorbed by the currents as shown by the dashed lines in FIG. 1D.

Here, Table 2 lists the operations in comparison between the prior art voltage supply protection circuit (FIGS. 5A to 5D) and the invention voltage supply protection circuit (shown in FIGS. 11A to 11D).

TABLE 2

| | PRIOR ART SUPPLY PROTECT CIRCUIT | | INVENTION SUPPLY PROTECT CIRCUIT | |
|---|---|---|---|---|
| | (−) TO $V_{CC}$ | (+) TO $V_{CC}$ | (−) TO GND | (+) TO GND |
| GND IS GROUNDED | BIPOLAR | BREAKDOWN | BIPOLAR | BIPOLAR |
| $V_{CC}$ IS GROUNDED | BIPOLAR | BIPOLAR | BIPOLAR | BIPOLAR |

In table 1, "(−) or (+) to $V_{cc}$" implies that a negative (−) or positive (+) voltage is applied to the $V_{cc}$ terminal of the voltage supply protection circuit. Further, "(−) or (+) to GND" implies that a negative (−) or positive (+) voltage is applied to the GND terminal of the voltage supply protection circuit.

As described above, in the voltage supply protection circuit according to the present invention, since the bipolar operation can be established in all the modes before the breakdown operation, it is possible to absorb surge voltage only in dependence upon the bipolar operation.

Figure 12:
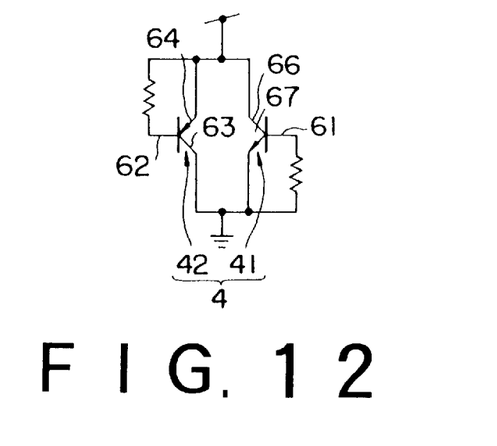
FIG. 12 is a circuit diagram showing the circuit structure of a second embodiment of the voltage supply protection circuit according to the present invention.
Figure 13:
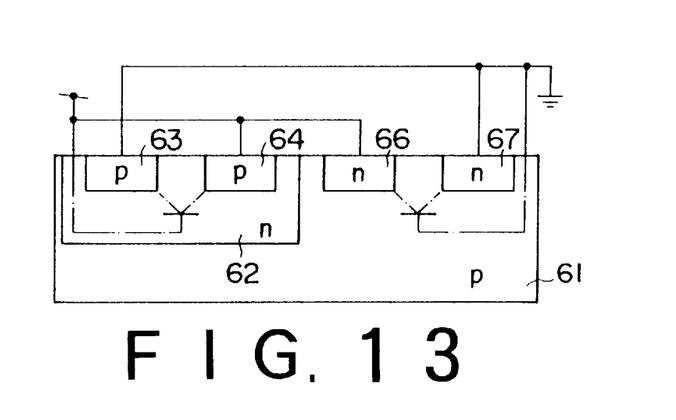
FIG. 13 is a cross-sectional view showing the device structure of the second embodiment of the voltage supply protection circuit shown in FIG. 12.

FIG. 12 shows a second embodiment of the voltage supply protection circuit according to the present invention. In this second embodiment, the voltage supply protection circuit 4' is composed of an NPN bipolar transistor 41 and a PNP bipolar transistor 42. The device structure thereof is shown in FIG. 13, which corresponds to that obtained by removing the gate electrodes 65 and 68 from the device shown in FIGS. 11A to and 11D. Further, the operation principle is the same as with the case explained with reference to shown in FIGS. 11A and 11D.

In the above-mentioned embodiments, the conductive types of the respective elements are not fixed nor limitative. Any transistor of other conductive type can be used appropriately, as far as the breakdown operation will not occur.

What is claimed is:

1. An input protection circuit for a semiconductor integrated circuit device, comprising:

a first transistor of an NPN bipolar type having a base grounded and a collector connected to a first voltage supply;

a second transistor of a PNP bipolar type having a base and a collector connected to a second voltage supply;

an input terminal and an output terminal both connected to said intermediate junction point between said first and second transistors and to the base of said second transistor; and the first and second voltage supplies being so selected that when a surge voltage is applied to said input terminal, both said first and second transistors cause bipolar transistor function or punch through phenomenon without causing breakdown.

2. The protection circuit of claim 1, which further comprises a resistor connected to said output terminal.

3. An input protection circuit for a semiconductor integrated circuit device, comprising:

a first transistor of an N-channel MOS type having a gate and a backgate connected to a first voltage supply and one end connected to a second voltage supply;

a second transistor of a PNP bipolar type having a base and a collector connected to the second voltage supply;

an input terminal and an output terminal both connected to said intermediate junction point between said first and second transistors and to the base of said second transistor; and the first and second voltage supplies being so selected that when a surge voltage is applied to said input terminal, both said first and second transistors cause bipolar transistor function or punch through phenomenon without causing breakdown.

4. The protection circuit of claim 3, which further comprises a resistor connected to said output terminal.

5. A protection circuit for a semiconductor integrated circuit device, comprising:

a first-conductivity type semiconductor substrate;

a second-conductivity type well region formed on a surface of said first-conductivity type semiconductor substrate and connected to a first voltage supply terminal;

a first first-conductivity type diffusion region connected to the first voltage supply terminal, and a second first-conductivity type diffusion region connected to a second voltage supply terminal, said first and second first-conductivity type diffusion regions being both formed on a surface of said second-conductivity type well region by a predetermined distance away from each other;

a first second-conductivity type diffusion region connected to the first voltage supply terminal, and a second second-conductivity type diffusion region connected to the second voltage supply terminal, said first and second second-conductivity type diffusion regions being both formed on the surface of said first-conductivity substrate; and when a surge voltage is applied to the first and second voltage supply terminals respectively, the applied surge voltage being absorbed by a first bipolar transistor formed by said first and second first-conductivity type diffusion regions with said second-conductivity well region as a base thereof, and by a second bipolar transistor formed by said first and second second-conductivity diffusion regions with said semiconductor substrate as a base.

6. The protection circuit of claim 5, which further comprises:

a first gate electrode formed on a surface of said second-conductivity type well region between said first and second first-conductivity type diffusion regions via an insulating film and connected to the first voltage supply terminal; and a second gate electrode formed on the surface of said semiconductor substrate between said first and second second-conductivity type diffusion regions via the insulating film and connected to the second voltage supply terminal.

7. A protection circuit for a semiconductor integrated circuit device, comprising:

a first-conductivity type semiconductor substrate;

a second-conductivity type well region formed on a surface of said first-conductivity type semiconductor substrate and connected to an input terminal and an output terminal;

a first first-conductivity type diffusion region formed on a surface of said second-conductivity type well region and connected to the input terminal;

a second first-conductivity type diffusion region formed on the surface of said second-conductivity type well region and connected to a first voltage supply terminal; and when a surge voltage is applied to the input terminal, the applied surge voltage being absorbed by a bipolar transistor formed by said first and second first-conductivity type diffusion regions with said second-conductivity well region as a base thereof.

8. The protection circuit of claim 7, which further comprises:

a first second-conductivity type diffusion region formed on the surface of said semiconductor substrate and connected to the input terminal; and a second second-conductivity type diffusion region formed on the surface of said semiconductor substrate a predetermined distance away form said first second-conductivity type diffusion layer, and connected to a second supply voltage terminal.

9. The protection circuit of claim 8, which further comprises a gate electrode formed on said semiconductor substrate between said first and second second-conductivity type diffusion regions via an insulating film and connected to the input terminal.

* * * * *